United States Patent
He

(10) Patent No.: US 6,963,624 B1
(45) Date of Patent: Nov. 8, 2005

(54) METHOD AND APPARATUS FOR RECEIVING RADIO FREQUENCY SIGNALS

(76) Inventor: Guoyu He, Department of Electronic Engineering, Beijing University of Aeronautics Astronautics, Beijing 100083 (CN)

( * ) Notice: Subject to any disclaimer, the term of this patent is extended or adjusted under 35 U.S.C. 154(b) by 617 days.

(21) Appl. No.: 09/650,236

(22) Filed: Aug. 29, 2000

(51) Int. Cl.$^7$ .............................. H03D 3/22; H04L 27/22
(52) U.S. Cl. ........................................ 375/329; 375/316
(58) Field of Search ..................... 375/136, 316–352; 331/16; 329/318; 327/113; 455/14, 552.1, 455/552, 226.1, 302, 234.1

(56) References Cited

U.S. PATENT DOCUMENTS

| | | | |
|---|---|---|---|
| 4,048,567 A | 9/1977 | Johnston et al. | |
| 4,510,622 A | 4/1985 | Mori et al. | |
| 4,516,270 A | 5/1985 | Phillips | |
| 4,719,463 A | 1/1988 | Chabah | |
| 4,984,293 A | 1/1991 | Cummings et al. | |
| 5,125,008 A | 6/1992 | Trawick et al. | |
| 5,140,198 A * | 8/1992 | Atherly et al. | 327/113 |
| 5,230,097 A * | 7/1993 | Currie et al. | 455/226.1 |
| 5,280,637 A | 1/1994 | Larosa et al. | |
| 5,455,845 A | 10/1995 | Sullivan | |
| 5,548,244 A | 8/1996 | Clewer | |
| 5,987,075 A * | 11/1999 | Abe et al. | 375/334 |
| 6,445,726 B1 * | 9/2002 | Gharpurey | 375/136 |
| 6,714,776 B1 * | 3/2004 | Birleson | 455/302 |

FOREIGN PATENT DOCUMENTS

| | | |
|---|---|---|
| EP | 0 769 846 A | 4/1997 |
| WO | WO 02/19515 | 3/2002 |

* cited by examiner

*Primary Examiner*—Stephen Chin
*Assistant Examiner*—Curtis Odom
(74) *Attorney, Agent, or Firm*—Walter J. Tencza, Jr.

(57) ABSTRACT

The present invention relates to a method and apparatus for receiving or converting a radio frequency signal. In particular, the present invention relates to a method and apparatus using an electronic circuit to combine a radio frequency signal, also known as a test signal, its reference signal and a third signal which has its predetermined frequency. The combination of these three signals gives rise to a new signal. The new signal has a frequency that is solely responsive to the predetermined frequency of the third signal. It also has phase information that is responsive to that of the test signal. In addition, the new signal may also have amplitude information that is responsive to that of the test signal.

14 Claims, 6 Drawing Sheets

METHOD AND APPARATUS FOR RECEIVING RADIO FREQUENCY SIGNALS

BACKGROUND

The present invention relates to a methods and apparatus for receiving radio frequency signals. More particularly, it relates to a method and apparatus for converting a radio frequency signal to a signal with a predetermined frequency without affecting its phase or amplitude measurement.

Transmission of a radio frequency signal usually requires multiple frequency conversion steps. For example, a low frequency signal is generally converted to a high frequency signal before it is transmitted by various means. After it is received, this converted high frequency signal is then down-converted to a signal of a same or similar low frequency for further processing. This approach is widely practiced in many areas, particularly in the area of telecommunication.

A radio frequency signal is a complex signal composed of several important parameters, including phase, amplitude, and frequency. One key aspect of the signal transmission process is how to preserve information concerning a signal's phase and amplitude. This is especially important when such a signal is being converted to another frequency. Over the past years, extensive research efforts have been made to minimize impact on a radio frequency signal's phase and amplitude information during the frequency conversion process.

There are a number of prior art approaches on how to preserve a radio frequency signal's phase and amplitude information while converting its frequency. Most prior art approaches employ one or multiple offset signals separately generated. These offset signals are then combined with test signals to provide signals at another frequency.

One example of these prior art approaches is a microwave receiver, herein briefly described in FIG. 1. It is generally used for the measurement of radar cross section. This microwave receiver employs a three-level frequency conversion process. It first comprises a local oscillator or similar devices which generate an offset signal. The combination of this offset signal with either a test signal or a reference signal gives rise to signals at a frequency of 2 GHz. These 2 GHz signals are then similarly converted to intermediate frequency signals at 45 MHz, which are further downconverted to a low frequency at 5.02 KHz for processing.

Another example is a network analyzer, herein briefly described in FIG. 2. It also uses local oscillators to generate offset signals. These offset signals are first combined with either a test signal or its reference signal to provide signals of an intermediate frequency at 20–27.8 MHz. These intermediate frequency signals are then converted to signals at a frequency of 278 KHz before being further processed.

In order to preserve information regarding a test signal's phase and amplitude, most prior art approaches attempt to convert a test signal, as well as its reference signal, to a precise frequency or a very narrow frequency range. But one problem is that most test signals, as well as their reference signals, are relatively unstable. In other words, their frequencies may be constantly fluctuating. This may be due to various reasons, such as limitation of signal sources or instability of power voltage.

To solve this problem, many prior art approaches employ a device called phase-locked loop (PLL), as shown in FIG. 1. One primary function of a PLL, as well as other similar devices, such as digital frequency synthesizers, is to provide a converted signal that maintains a constant phase angle relative to a reference signal just like the original, unconverted signal. The underlying mechanism is to control the offset signal's frequency so that it is constantly adjusted according to variations of a test signal's frequency. In this way, a test signal, as well as its reference signal, may be converted to a particular frequency or a narrow frequency range without affecting measurements of its phase and amplitude. Other approaches, as shown in FIG. 2, also employ devices, such as pass band filter, to facilitate this process so that only signals within a narrow frequency range may pass through.

The use of these devices, however, gives rise to several problems. First of all, because of their reliance on these devices, most prior art approaches either are incapable of handling signals with a wide frequency range, or they lack sensitivity, dynamic range or frequency agility generally required for measuring a radio frequency signal with precision. Meanwhile, the use of these devices inevitably increases systematic errors which may eventually affect the accuracy of measurements. Finally, most of these devices are complicated and expensive.

SUMMARY OF THE INVENTION

The present invention relates to a method and apparatus for receiving or converting a radio frequency signal. In particular, the present invention relates to a method and apparatus using an electronic circuit to combine a radio frequency signal, also known as a test signal, its reference signal and a third signal which has its predetermined frequency. The combination of these three signals gives rise to a new signal. The new signal has a frequency that is solely responsive to the predetermined frequency of the third signal. It also has phase information that is responsive to that of the test signal. In addition, the new signal may also have amplitude information that is responsive to that of the test signal.

Briefly described here, one embodiment of the present invention may involve the use of an electronic circuit that receives or processes a test signal and its reference signal, both of which have a frequency of F1. It further includes a signal source, such as a crystal-stabilized oscillator, that generates a third signal with a predetermined frequency of F2. Using a multiplier, the test signal and the third signal are combined to provide an output signal (F1+F2/F1−F2).

Meanwhile, the reference signal is divided into two branches. One branch of the reference signal undergoes a 90 degree phase shift and is then transmitted to a second multiplier. The other branch of the reference signal is directly transmitted to a third multiplier. The second and third multipliers respectively combine the output signal (F1+F2/F1−F2) from the first multiplier to either the phase-shifted reference signal or the reference signal without being phase shifted. They in turn provide two separate output signals, both of which have the predetermined frequency of F2. One of these two output signals further undergoes a 90 degree phase shift. Then, upon adjusting their amplitudes, these two output signals are added together in an adder or similar devices to provide a new signal. The new signal has a frequency of F2 which is solely responsive to the predetermined frequency of the third signal and it has phase and amplitude information that is responsive to that of the test signal.

Implementations may include one or more of the following advantages. The present invention may convert a radio frequency signal to a different frequency without affecting its phase and amplitude measurements and is particularly useful in converting a radio frequency signal of high frequencies, including a milliwave signal, to a low frequency signal. As a result, the present invention may be applied in the areas of radio cross section measurement, network analysis, electronic equipment test, as well as other radio frequency signal communications.

In addition, this present invention provides a simple and inexpensive approaches for accurately converting radio frequency signals to a predetermined frequency without the necessity of PLLs and other complicated devices. This is particularly useful in the area of telecommunications.

Finally, the present invention also provides an improved method of receiving radio frequency signals by consuming less power. This is particularly useful in the area of wireless communications.

BRIEF DESCRIPTION OF THE DRAWING FIGURES

DETAILED DESCRIPTION OF THE DRAWING FIGURES

Figure 1:
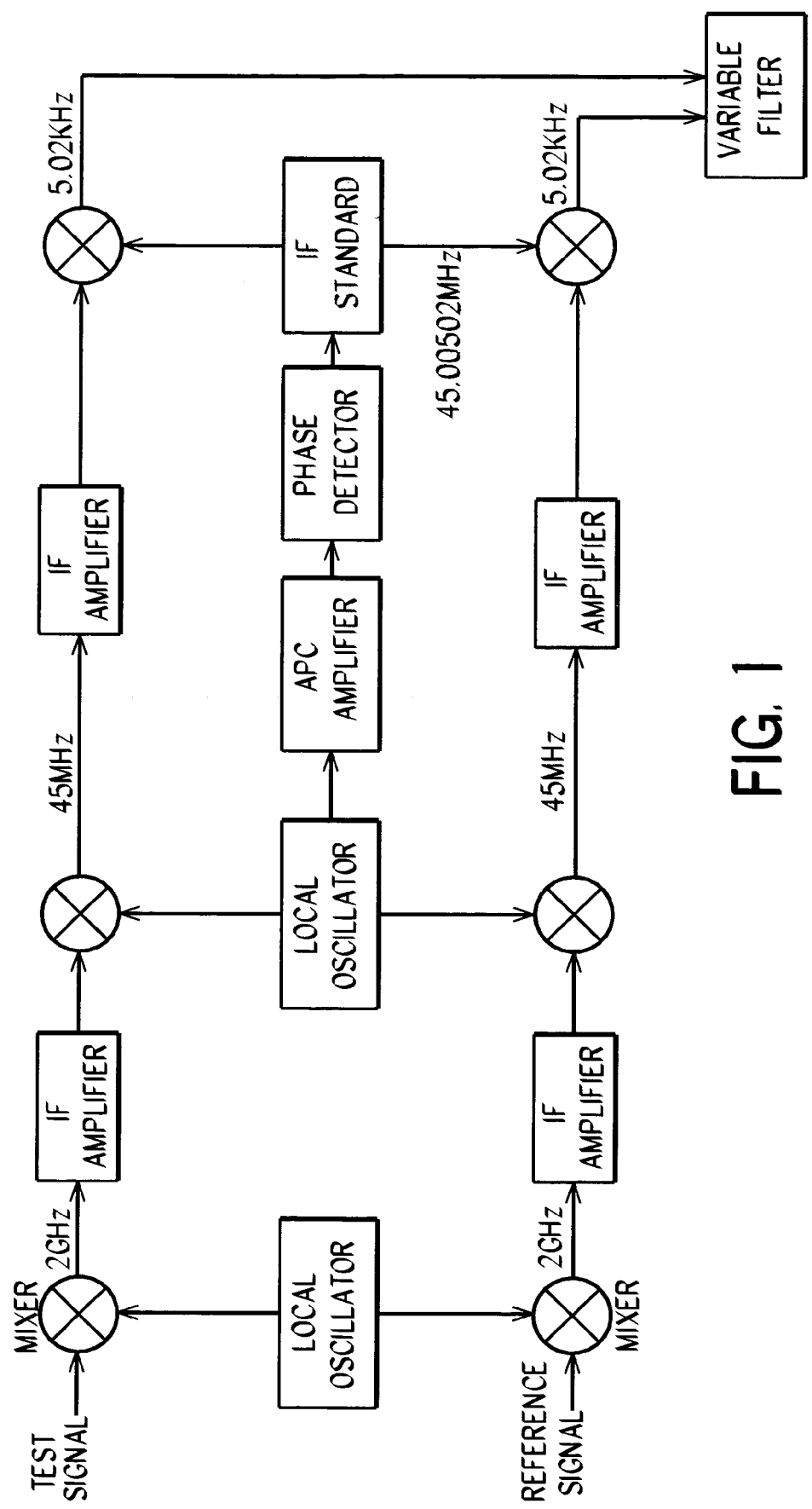
FIG. 1 is a block diagram of a prior art example which is a microwave receiver, showing its basic components and mechanism.
Figure 2:
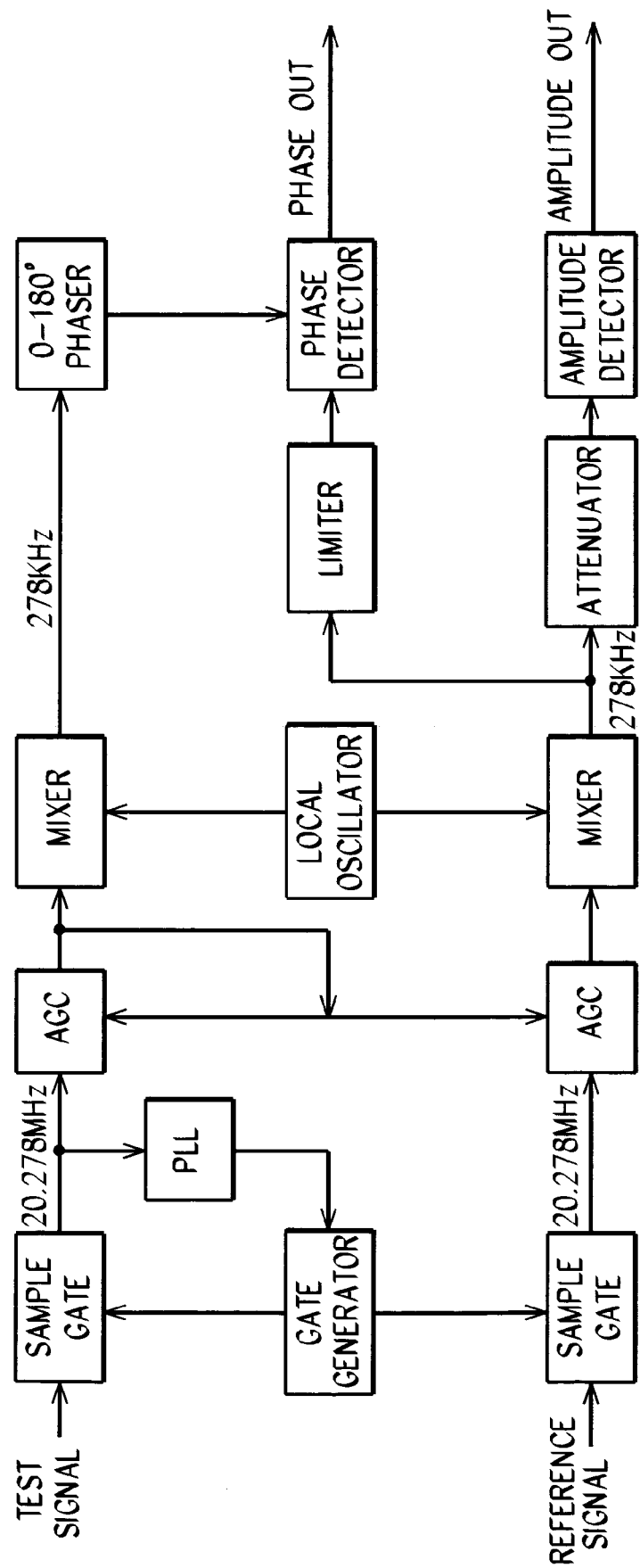
FIG. 2 is a block diagram of a second prior art example, which is a network analyzer, showing its basic components and mechanism.
Figure 3:
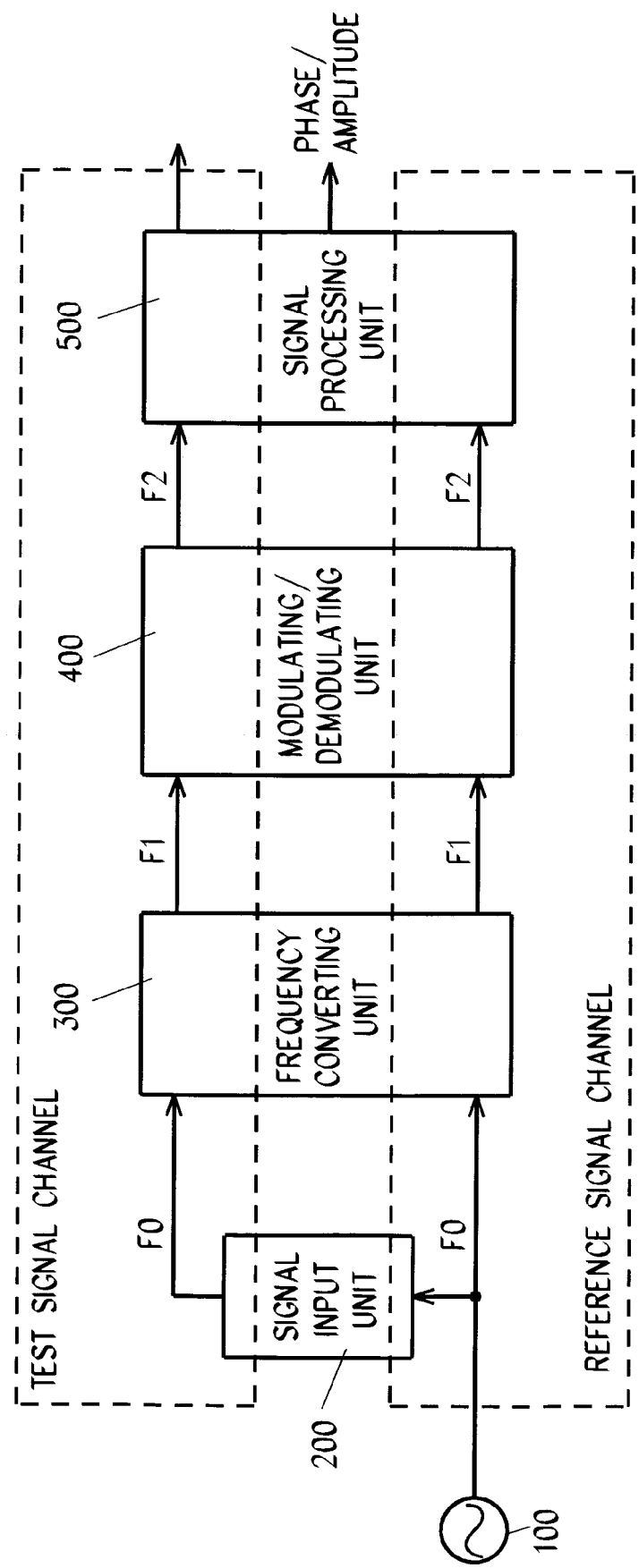
FIG. 3 is a block diagram of one embodiment of the present invention, including a signal input unit, a frequency converting unit, a modulating/demodulating unit, and a signal processing unit.

Referring now to the drawings, like numerals indicate like elements throughout the several drawing figures. FIG. 3 provides a brief drawing of one embodiment of the present invention. This embodiment encompasses four different units, including a signal input unit 200, a frequency (IF) converting unit 300, a modulating/demodulating unit 400, and a signal sampling unit 500. It should be understood that the present invention is not limited to these four units of this particular embodiment.

Signal Input Unit

The signal input unit 200 is used for receiving or collecting radio frequency signals. Its primary function is to collect or generate radio frequency signals to be further converted or processed. As shown in FIG. 3, it may comprise a signal source 100, which generates a test signal and its reference signal. The signal input unit 200 may further comprise other elements. For example, for measuring radar cross section, the signal input unit 200 may comprise one antenna that collects and transmits signals. For testing antennas, the signal input unit 200 may comprise one or multiple antennas. For testing an electronic device, the signal input unit 200 may simply refer to the cable that transmits signals for further processing. It should be emphasized that the selection of different elements for the signal input unit 200 often depends upon how the present invention is going to be applied.

Frequency Converting Unit

Figure 4:
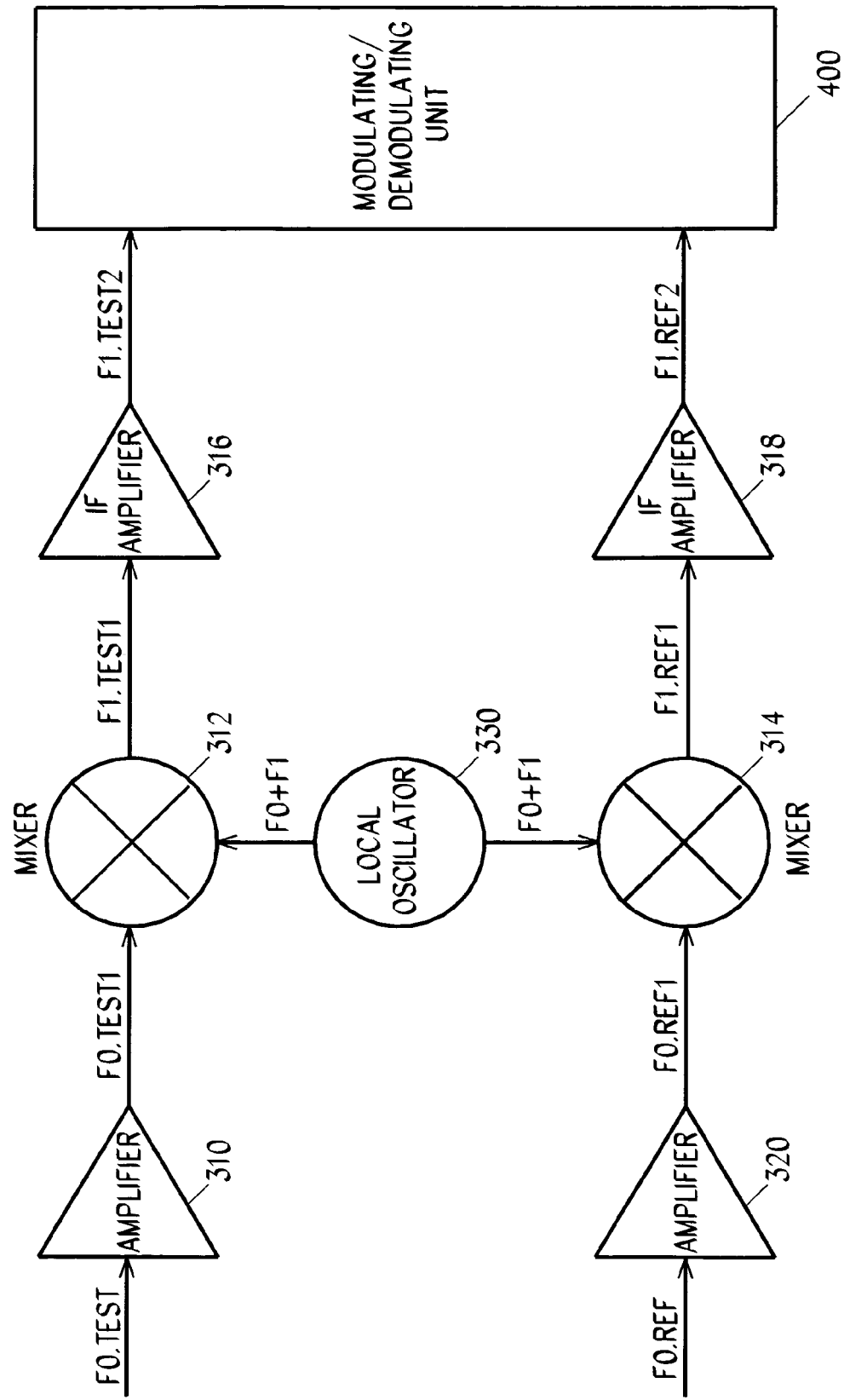
FIG. 4 is a block diagram of the frequency converting unit shown generally in FIG. 3, including components used in one embodiment of the present invention.

The next component of this particular embodiment is a frequency converting unit 300, as shown in FIG. 3. It converts high frequency signals to intermediate frequency signals. FIG. 4 describes one example of such a device.

The frequency converting unit 300 generally comprises two separate signal channels. One is a test signal channel and the other is the reference signal channel. At this stage, the two signal channels are usually separate but remain coherent.

The test signal channel often comprises a first microwave amplifier 310. Its primary function is to increase weak signals. The use of such a microwave amplifier should not affect a signal's phase and frequency information. Conventional microwave amplifier may be used. The selection of this microwave amplifier 310 usually depends upon a signal's frequency range.

This microwave amplifier 310 first receives a test signal (F0.TEST), collected or transmitted from the signal input unit 200. In turn, it provides an output signal (F0.TEST1), which should retain the test signal's phase and frequency information. Such an output signal (F0.TEST1) may generally be represented by the following equation (1)

$$u_{test1}(t) = U_{test1} \cos(\omega_0 t + \phi_{test}) \quad (1)$$

wherein $u_{test1}(t)$ refers to the output signal (F0.TEST1) from the first microwave amplifier 310; $U_{test1}$ refers to its amplitude which should be responsive to that of the test signal (F0.TEST); $\omega_0$ is the signal's radian frequency, also known as $2\pi F0$, wherein F0 is the signal's frequency; and $\phi_{test}$ refers to the signal's phase which should be equivalent to that of the test signal (F0.TEST).

Similarly, the reference signal channel also comprises a microwave amplifier 320. Parallel to the amplifier 310, it receives a reference signal (F0.REF) from the signal input unit 200 and provides an output signal (F0.REF1). The output signal (F0.REF1) may generally be represented by the following equation (2)

$$u_{ref1}(t) = U_{ref1} \cos \omega_0 t \quad (2)$$

wherein $u_{ref1}(t)$ refers to the output signal (F0.REF1); $U_{ref1}$ is the reference signal's amplitude which should be responsive to that of the reference signal (F0.REF); and $\omega_0$ is the signal's radian frequency which may also be represented as $2\pi F0$, wherein F0 is the signal's frequency.

In this embodiment, it is often desirable for the two microwave amplifiers 310 and 320 to be identical in order to maintain coherency between the test and reference signal channels. It should be further noted that the use of these two amplifiers 310, 320 may not be necessary if a test signal and its reference signal are strong enough for subsequent conversion.

The frequency converting unit 300 further comprises a signal source, usually a local oscillator 330. Its primary function is to generate an offset signal with a frequency of F0+F1 to be used for frequency conversion. Conventional local oscillators without PLLs should be adequate even though other similar devices, including digital frequency synthesizers, may also be used.

An offset signal so generated may comprise a high frequency component (F0) and an intermediate frequency component (F1). F0 generally refers to a test signal's frequency as mentioned above. Such an offset signal (F0+F1) may generally be represented by the following equation (3):

$$u_{LO}(t)=U_{LO}\cos[(\omega_0+\omega_1)t+\phi_{LO}] \quad (3)$$

wherein $u_{LO}(t)$ refers to the offset signal (F0+F1) generated by the local oscillator 330; $U_{LO}$ refers to the signal's amplitude; $\omega_0$ refers to the signal's radiant frequency, also known as $2\pi F0$, wherein F0 refers to the test signal's frequency (F0.TEST), as provided in equation (1); $\omega_1$ refers to the signal's intermediate radiant frequency as determined by $2\pi F1$, wherein F1 is an intermediate frequency value; $\phi_{LO}$ refers to the signal's phase.

F1 may be any intermediate frequency value that is optimal or within a reasonable range. One embodiment of the present invention uses F1 between 50–200 MHz. But it should be understood that other intermediate frequency values may also be used as F1. This intermediate frequency value (F1) may be adjusted according to a test signal's frequency (F0).

In addition, it should also be mentioned that the selection of an offset signal's frequency may not be limited to F0+F1. In other embodiments of the present invention, an offset signal with a frequency of F0–F1 may also be used to have the same effect. Furthermore, it is also common for a test signal, instead of the offset signal, to have two frequency components of F0 and F1. Under these situations, the offset signal generated by the local oscillator 330 may have one frequency component of F0, instead of F0 and F1.

The offset signal (F0+F1) generated by the local oscillator 330 is then split and equally transmitted to the test signal and reference signal channels. A power splitter, or other similar devices, may be use to evenly distribute this offset signal to the two signal channels.

This test signal channel further comprises a mixer 312. The offset signal (F0+F1) generated by the local oscillator 330 is transmitted to the mixer 312 as a first input signal. The mixer 312 also receives a second input signal (F0.TEST1), which is transmitted from the amplifier 310 and represented by the equation (1).

The combination of the test signal (F0.TEST1) and the offset signal (F0+F1) generally leads to a signal with two frequency components of either F1 or F0+2F1. Such a mixed signal is then filtered through a low pass band filter. The primary function of such a low pass band filter is to filter out the higher frequency component and only provides an output signal (F1.TEST1) with the frequency component of F1.

As a result, the microwave mixer 312 provides an output signal (F1.TEST1), as represented by the following equation (4):

$$u_{test2}(t)=U_{test2}\cos(\omega_1 t-\phi_{test}+\phi_{LO}) \quad (4)$$

wherein $u_{test2}(t)$ refers to the output signal (F1.TEST1), $U_{test2}$ refers to the signal's amplitude and is linear to the test signal's amplitude ($U_{test1}$); both $\omega_1$ and $\phi_{LO}$ may be determined by the above equation (3); and $\phi_{test}$ is the test signal's phase as determined by equation (1).

Similarly, the reference signal channel also comprises a mixer 314, which receives the offset signal (F1+F2) generated by the local oscillator 330 and the reference signal (F0.REF1) transmitted from the amplifier 320. It then provides an output signal (F1.REF1), as represented by the following equation (5):

$$u_{ref2}(t)=U_{ref2}\cos(\omega_1 t+\phi_{LO}) \quad (5)$$

wherein $u_{ref2}(t)$ refers to the output signal (F1.REF1) from the mixer 314; $U_{ref2}$ refers to the signal's amplitude and is linear to that of the reference signal ($U_{ref1}$); $\omega_1$ and $\phi_{LO}$ may be similarly determined by the above equation (3).

To maintain the coherency between the two signal channels, it is often helpful for the two mixers 312, 314 to be identical. Conventional microwave mixers with low pass band filters, or other similar devices, should be applicable. Meanwhile, it should be noted that the selection of the mixers 312, 314 usually depends upon a test signal's frequency range. For high frequency signals, harmonic mixers may be desirable. Other microwave mixers without band filters may also be used with the addition of low pass band filters or other types of band filters.

At an optimal amplitude, the two signals (F1.TEST1 and F1.REF1) provided by the two mixers 312, 314 may then be transmitted to the modulating/demodulating unit 400 for further processing. Sometimes, it may be desirable for the two signals to undergo additional amplification using two intermediate frequency amplifiers (IF amplifiers).

As shown in FIG. 4, the frequency converting unit 300 may further comprise two IF amplifiers 316, 318 in the test and reference signal channels, respectively. They receive the signals (F1.TEST1 and F1.REF1) provided by the mixers 312 and 314, amplify them to an optimal level, and then provide two output signals (F1.TEST2 and F1.TEST2). The two output signals (F1.TEST2 and F1.TEST2) should retain the phase and frequency information, and their amplitudes shall remain linear to that of the original test or reference signals (F0.TEST and F0.REF), respectively.

In alternative or in addition to IF amplifiers, automatic gaining circuits (AGCs) may also be used to adjust a signal's amplitude. Their primary function is to provide stable output signals at an optimal level. Most conventional AGCs may be used in the present invention.

Figure 5:
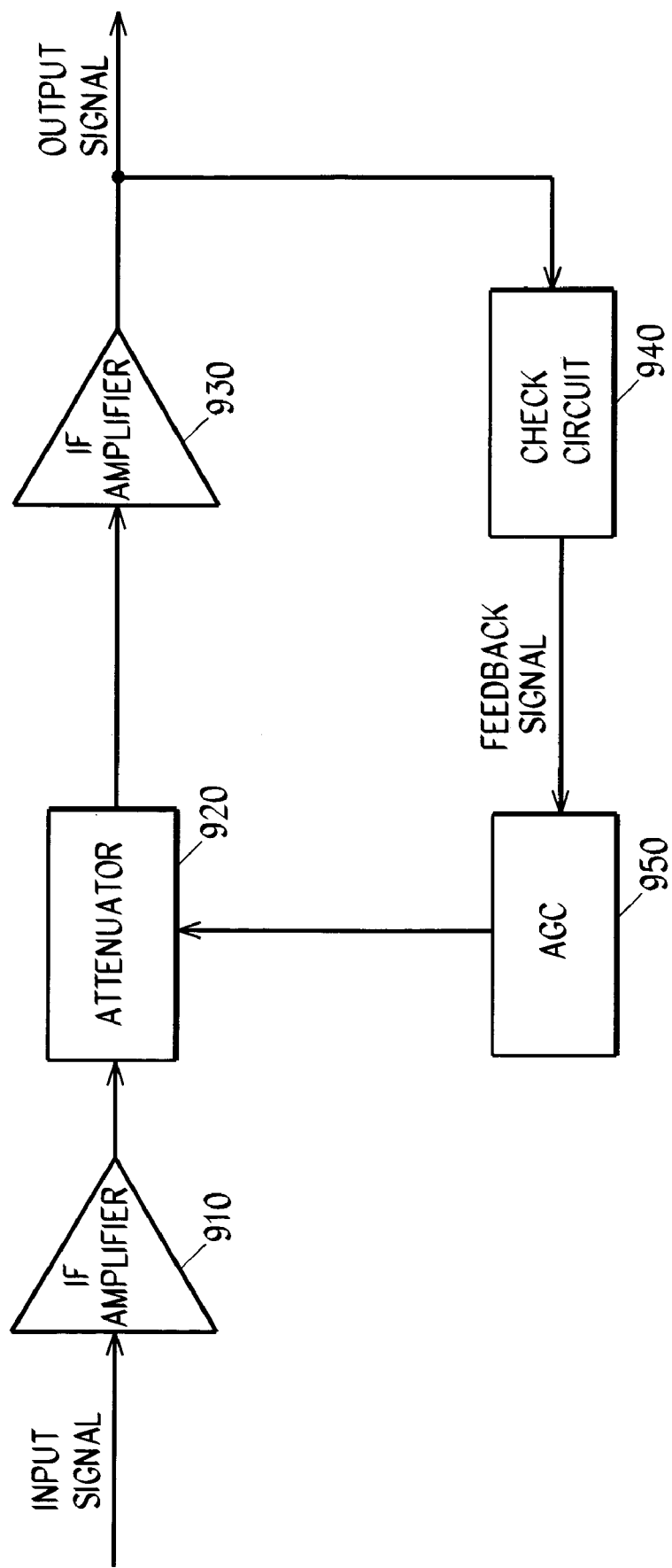
FIG. 5 is a block diagram of an Automate Gaining Circuit which may be employed in some embodiments of the present invention.

Shown in FIG. 5 is one example of such an AGC. It first comprises an IF amplifier 910, which receives an input signal and provides an amplified signal. This amplified signal is then transmitted to an attenuator 920. Upon receiving another signal which serves as a feedback signal and is derived from the final output signal, the attenuator 920 generates a signal which is further amplified by a second IF amplifier 930. This amplified signal by the second IF amplifier 930 is the final output signal. Meanwhile, the final output signal also serves as the feedback signal for any adjustment. It is first transmitted to a check circuit 940 for its amplitude and then to an AGC 950 for adjustment. After the adjustment, the signal is then transmitted back to the attenuator 920 as the feedback signal.

Finally, it should be understood that the frequency converting unit 300 hereby described is just part of one embodiment of the present invention. Depending upon a test signal's frequency and amplitude, part or the entire frequency converting unit 300 may be optional. It should be further understood that other devices or apparatus with similar functions may also be used for the practice of the present invention.

Modulating/Demodulating Unit

Figure 6:
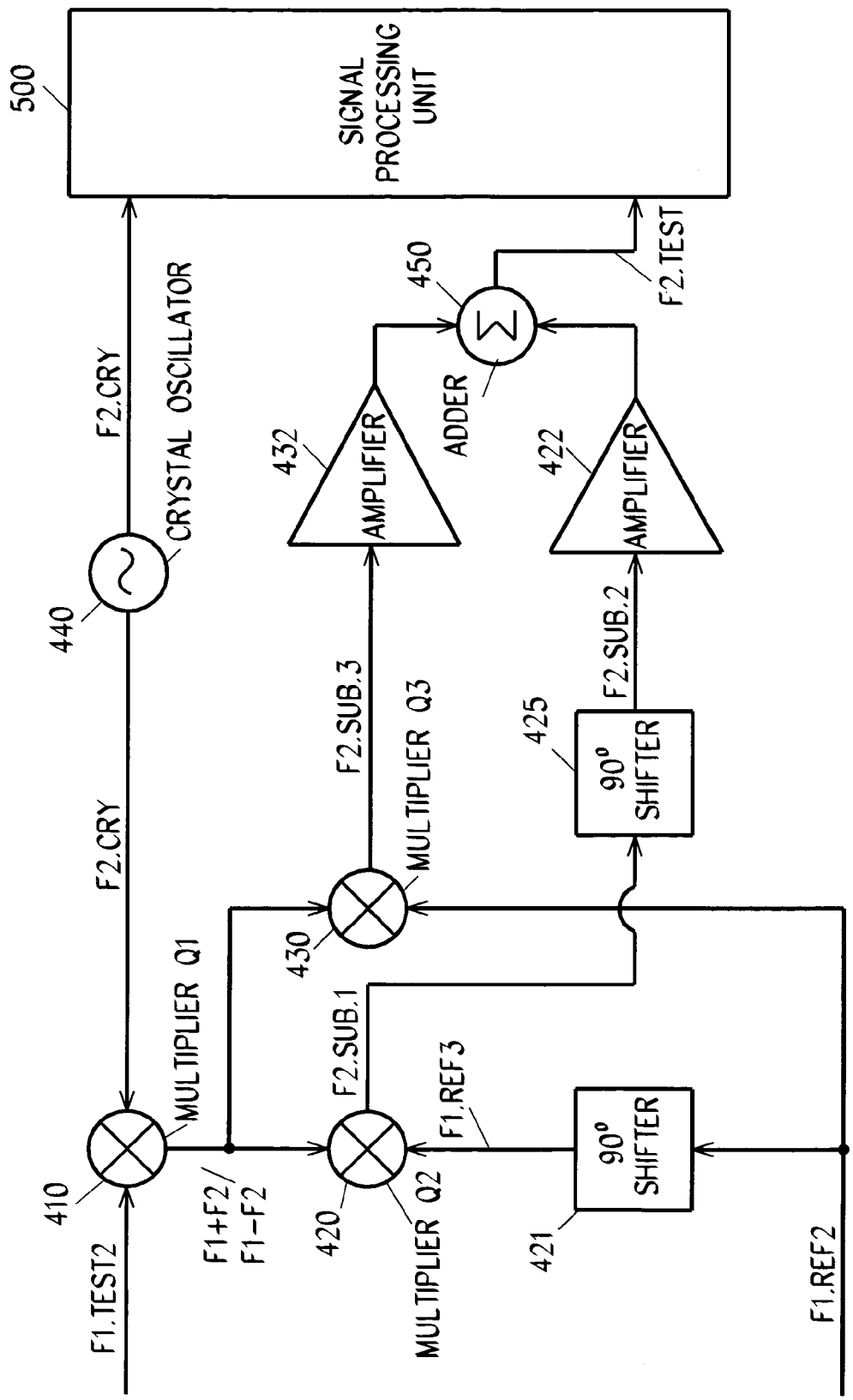
FIG. 6 is a block diagram of the Modulating/Demodulating unit shown generally in FIG. 3, including basic components used in one embodiment of the present invention.

FIG. 6 shows one embodiment of the modulating/demodulating unit 400 of the present invention. Its primary function is to combine a test signal, its reference signal, and a third signal with a predetermined frequency to provide a new signal. The new signal's frequency is solely responsive to the predetermined frequency of the third signal and its phase is responsive to that of the test signal. The test signal refers to the signal (F1.TEST2) provided by the frequency converting unit 300, and the reference signal refers to the signal (F1.REF2) also provided by the frequency converting unit 300.

The modulating/demodulating unit 400 first comprises a signal source, usually a crystal-stabilized oscillator 440, which generates a third signal (F2.CRY) with a predetermined frequency (F2). Such a signal (F2.CRY) may be represented by the following equation (6):

$$u_{cry}(t)=U_{cry} \cos (\omega_2 t+\phi_{cry}) \quad (6)$$

Wherein $u_{cry}(t)$ refers to the third signal (F2.CRY); $U_{cry}$ refers to the signal's amplitude; $\omega_2$ refers to the signal's radiant frequency, also known as $2\pi F2$, wherein F2 is the signal's predetermined frequency; $\phi_{cry}$ refers to the signal's phase.

Depending upon a test signal's approximate frequency range, F2 may be a predetermined frequency value. For example, for a test signal with an intermediate frequency of approximate 100 MHz, F2 may be predetermined to be a frequency between 5–20 KHz. As long as a test signal's frequency remains within a reasonable range, F2 may be the same predetermined frequency. However, it should be understood that this frequency of F2 may also be adjusted if a test signal's approximate frequency range changes significantly. It should be further understood that the frequency range of F2 provided above is just one example, and the present invention shall not be limited to this frequency range.

The signal (F2.CRY) so generated is transmitted to a first multiplier Q1 410, as shown in FIG. 6. In addition, the first multiplier Q1 410 also receives a test signal (F1.TEST2), provided by the frequency converting unit 300. As a result, the multiplier 410 combines these two signals and provides an output signal (F1+F2/F1−F2). This output signal usually include two frequency components at F1+F2 and F1−F2. Such an output signal (F1+F2/F1−F2) may be generally represented by the following equation (7):

$$u_{F1+F2/F1-F2}(t)=U_{F1+F2/F1-F2} \cos [(\omega_1+\omega_2)t-\phi_{test}+\phi_{LO}+\phi_{cry}] + U_{F1+F2/F1-F2} \cos [(\omega_1-\omega_2)t-\phi_{test}+\phi_{LO}-\phi_{cry}] \quad (7)$$

wherein $u_{F1+F2/F1-F2}(t)$ refers to the output signal (F1+F2/F1−F2); $U_{F1+F2/F1-F2}$ refers to the signal's amplitude and is responsive to both $U_{cry}$ and $U_{test1}$ as determined by the equations (6) and (1), respectively; and the other values may be incorporated from equations (4) and (6).

This output signal (F1+F2/F1−F2) is then divided and respectively transmitted to a second multiplier Q2 420 and a third multiplier Q3 430. It is often helpful for the output signal (F1+F2/F1−F2) to be equally transmitted to the two multiplier, Q2 and Q3. As a result, a power splitter, or other similar devices, may be used to evenly distribute the output signal (F1+F2/F1−F2) to the two multipliers. But it should be emphasized that the use of such a power splitter should not affect the output signal's phase and frequency.

Similarly, the reference signal (F1.REF2) is also evenly divided into two branches. Again, the use of a power splitter may also be helpful. The first branch of the reference signal is transmitted through a 90 degree phase shifter 421. Its primary function is to shift the signal's phase 90 degree without changing its frequency and amplitude. As a result, the 90 degree phase shifter 421 provides an output signal (F1.REF3), which may be represented by the following equation (8):

$$u_{ref3}(t)=U_{ref3} \sin (\omega_1 t+\phi_{LO}) \quad (8)$$

wherein $u_{ref3}(t)$ refers to the output signal (F1.REF3); $U_{ref3}$ refers to the signal's amplitude that is derived from the reference signal (F1.REF2)'s amplitude ($U_{ref2}$) presented in the equation (5); and the other values may be similarly incorporated from the equation (5), as provided above.

Meanwhile, the second branch of the reference signal (F1.REF2) is transmitted to a third multiplier Q3 430. As mentioned above, this third multiplier (Q3) 430 also receives the output signal (F1+F2/F1−F2), generated by the first multiplier Q1 410. The combination of these two signals gives rise to a combined signal with two frequency components. Such a signal may be represented by the following equation (9):

$$u_{test4'}(t)=U_{m1} \cos [(\omega_1+\omega_2)t-\phi_{test}+\phi_{LO}+\phi_{cry}] \cos (\omega_1 t+\phi_{LO})+U_{m1} \cos [(\omega_1-\omega_2)t-\phi_{test}+\phi_{LO}-\phi_{cry}] \cos (\omega_1 t+\phi_{LO}) \quad (9)$$

wherein $u_{test4'}(t)$ refers to this combined signal; $U_{m1}$ refers to the signal's amplitude which is responsive to $U_{F1+F2/F1-F2}$ and $U_{ref2}$ from the equations (7) and (5), respectively; and the other values may be incorporated from the equations (7) and (5), as provided above. This combined signal then goes through a low pass band filter and gives rise to an output signal (F2.SUB.3) as represented by the following equation (10):

$$u_{test4}(t)=\tfrac{1}{2}U_{m1} \cos (\omega_2 t-\phi_{test}+\phi_{cry})+\tfrac{1}{2}U_{m1} \cos (\omega_2 t+\phi_{test}+\phi_{cry}) \quad (10)$$

wherein $u_{test4}(t)$ refers to the output signal (F2.SUB.3); and the other values may be incorporated from the above equation (9).

Similarly, the second amplifier Q2 420 also receives two signals. One is the signal (F1.REF3), provided by the first 90 degree phase shifter 421, and the other is the signal (F1+F2/F1−F2), generated by the first multiplier Q1 410. Similarly, the combination of these two signals gives rise to a signal which may be represented by the following equation (11):

$$u_{test3'}(t)=U_{m2} \cos [(\omega_1+\omega_2)t-\phi_{test}+\phi_{LO}+\phi_{cry}] \sin (\omega_1 t+\phi_{LO})+U_{m2} \cos [(\omega_1-\omega_2)t-\phi_{test}+\phi_{LO}-\phi_{cry}] \sin (\omega_1 t+\phi_{LO}) \quad (11)$$

wherein $u_{test3'}(t)$ refers to the combined signal; $U_{m2}$ refers to the signal's amplitude and is responsive to $U_{F1+F2/F1-F2}$ and $U_{ref2}$ from the equations (7) and (5), respectively; and the other values may be incorporated from the above equations (5) and (7). This signal then goes through a low pass band filter, which in turn provides an output signal (F2.SUB.1). Such an output signal (F2.SUB.1) may generally be represented by the following equation:

$$u_{test3}(t)=-\tfrac{1}{2}U_{m2} \sin (\omega_2 t-\phi_{test}+\phi_{cry})+\tfrac{1}{2}U_{m2} \sin (\omega_2 t+\phi_{test}+\phi_{cry}) \quad (12)$$

Wherein $u_{test3}$ refers to the output signal (F2.SUB.1); and the other values may be incorporated from the above equation (11).

It should be noted that the drawing presented in FIG. 6 does not explicitly indicate the use of a low pass band filter. But it should be understood that the multipliers Q2 and Q3 420, 430 herein used should contain such low pass band filters or similar devices. Of course, other conventional multipliers without such filters may also be used with the addition of low pass band filters or other types of band filters.

The output signal (F2.SUB.1) generated by the second multiplier Q2 420 is then transmitted to a second 90 degree phase shifter 425. Similar to the first 90 degree phase shifter 421, its function is to shift a signal's phase for 90 degree without affecting its phase or amplitude information. It in turn provides an output signal (F2.SUB.2), which may be represented by the following equation (13):

$$u_{test5}(t)=\tfrac{1}{2}U_{m2}\cos(\omega_2 t-\phi_{test}+\phi_{cry})-\tfrac{1}{2}U_{m2}\cos(\omega_2 t+\phi_{test}+\phi_{cry}) \quad (13)$$

wherein $u_{test5}(t)$ refers to the output signal (F2.SUB.2); and the rest values may be incorporated from the equation (12).

The two output signals, (F2.SUB.2) and (F2.SUB.3) are then respectively transmitted to two amplifiers 422, 432. One primary function of these two amplifiers is to make sure that the two output signals, (F2.SUB.2 and F2.SUB.3), have the same optimal amplitude before they are added together in an adder 450. In addition, they may also be used to amplify weak signals for further processing. But it should be understood that the use of these two amplifiers may be optional if the two signals (F2.SUB.2 and F2.SUB.3) have the same optimal amplitude.

The selection of amplifiers 422, 432 generally depends upon a signal's frequency range, which in this case is the predetermined frequency of F2. For low frequency signals with a frequency between 5–20 KHz, conventional audio amplifiers should be adequate. It should be noted that the use of these amplifiers should not affect the signals' phase and frequency information.

In addition, other devices such as AGCs may also be used. For example, an AGC may be used to receive the output signal (F2.SUB.3) generated by the third multiplier Q3 430 before they are transmitted to the adder 450. An AGC may provide a stable output signal and make sure the two signals (F2.SUB.2 and F2.SUB.3) maintain the same amplitude.

The output signals from these two amplifiers 422, 433 are then similarly transmitted to an adder 450, which adds the two signals together without altering their frequency and phase. The adder 450 may include both conventional adders and other device that functions similarly. As a result of this addition, the adder 450 provides a new signal (F2.TEST), which may be represented by the following equation (14):

$$u_{test6}(t)=U_m\cos(\omega_2 t-\phi_{test}+\phi_{cry}) \quad (14)$$

wherein $u_{test6}(t)$ refers to the new signal (F2.TEST); $U_m$ refers to the signal's amplitude and is usually responsive to either $U_{m2}$ or $U_{m1}$; the other values may be similarly incorporated from the above equation (13). This output signal (F2.TEST) is then transmitted to the next unit, the signal processing unit 500.

It should be noted from the above equation (14) that the new signal's (F2.TEST) frequency is solely responsive to the third signal (F2.CRY) generated by the crystal-stabilized oscillator 440, and its phase is responsive to that of the test signal (F1.TEST2). In addition, the new signal's amplitude ($U_m$) could also be responsive or be linear to that of the test signal (F1.TEST2).

Signal Processing Unit

The new signal (F2.TEST) generated by the modulating/demodulating unit 400 is then transmitted to a signal processing unit 500. Similarly transmitted to this unit is the third signal (F2.CRY) which serves as a new reference signal for the new signal (F2.TEST). The signal processing unit 500 measures or detects signals including their phase and amplitude information. By way of background, the signal processing unit 500 may include a computer or monitor for signal display, speakers for audio signals, and an A/D processor for converting a signal into a digital signal.

It should be understood that different methods or apparatus may be employed depending upon different appliances of the present invention.

Finally, the present invention should not be limited to the particular embodiment as described above. Other embodiments may be easily achieved by modifying or rearranging certain components, especially the two 90 degree phase shifters 421, 425, in the modulating/demodulating unit 400. Another embodiment of the present invention may include a rearrangement of the second 90 degree phase shifter 425. Instead of receiving the signal (F2.SUB.1) from the second multiplier 420, it may be used to phase shift the signal (F2.SUB.3) from the third multiplier 430. As a result, the two phase shifters 421, 425 are not on the same signal channel while the other components remain the same. This arrangement should not affect the appliance of the present invention.

Another example is to shift the position of the first 90 degree phase shifter 421. Instead of phase shifting the reference signal (F1.REF2), it may be used to phase shift one branch of the output signal (F1+F2/F1−F2) generated by the first multiplier Q1 410. This phase-shifted signal is then combined with a reference signal in either the second multiplier Q2 420 or the third multiplier Q3 430. With other components remaining the same, this arrangement may also be applied in the present invention. Finally, it must be understood that present invention may not be limited to the use of the specific components described above. Other devices or apparatus that have the same or similar function should be equally applicable.

What is claimed is:

1. An apparatus for converting a radio frequency (RF) signal and its reference signal comprising
    a signal source for providing a signal with a predetermined frequency;
    a first multiplier for combining a signal responsive to the RF signal and another signal responsive to the signal generated by the signal source, and providing at least one output signal;
    a second multiplier for combining a signal responsive to the reference signal and another signal responsive to the output signal from the first multiplier, and providing an output signal;
    a first 90 degree phase shifter for receiving a signal responsive to the reference signal, and generating an output signal;
    a third multiplier for combining a signal responsive to the output signal from the first multiplier and a signal responsive to the output signal from the fire 90 degree phase shifter, and providing an output signal;
    a second 90 degree phase shifter for receiving a signal responsive to a signal selected from the group consisting of the output signal from the second multiplier and the output signal from the third multiplier, and providing an output signal; and
    an adder for combining a signal responsive to the output signal from the second multiplier and another signal responsive to the output signal from the third multiplier, and providing a new signal.

2. An apparatus as described in claim 1 wherein the signal source is a crystal-stabilized oscillator.

3. An apparatus as described in claim 1 further comprising at least one power splitter.

4. An apparatus as described in claim 1 further comprising at least one signal amplifier.

5. An apparatus as described in claim 1 further comprising at least one automatic gaining circuit.

6. An apparatus as described in claim 1 further comprising a device for converting the RF signal and its reference signal to an intermediate frequency.

7. An apparatus as described in claim 1 further comprising a device for converting the new signal to a signal selected from the group consisting of an audio, video, digital and analog signal.

8. An apparatus for converting a radio frequency (RF) signal and its reference signal comprising
- a signal source for providing a signal with a predetermined frequency;
- a first multiplier for combining a signal responsive to the RF signal and another signal responsive to the signal generated by the signal source, and providing at least one output signal;
- a second multiplier for combining a signal responsive to the reference signal and another signal responsive to the output signal from the first multiplier, and providing an output signal;
- a first 90 degree phase shifter for receiving a signal responsive to the output signal from the first multiplier, and generating an output signal;
- a third multiplier for combining a signal responsive to the reference signal and another signal responsive to the output signal from the first 90 degree phase shifter, and providing an output signal;
- a second 90 degree phase shifter for receiving a signal responsive to a signal selected from the group consisting of the output signal from the second multiplier and the output signal from the third multiplier, and providing an output signal; and
- an adder for combining a signal responsive to the output signal from the second multiplier and another signal responsive to the output signal from the third multiplier, and providing a new signal.

9. An apparatus as described in claim 8 wherein the signal source is a crystal-stabilized oscillator.

10. An apparatus as described in claim 8 further comprising at least one power splitter.

11. An apparatus as described in claim 8 further comprising at least one signal amplifier.

12. An apparatus as described in claim 8 further comprising at least one automatic gaining circuit.

13. An apparatus as described in claim 8 further comprising an apparatus for converting the RF signal and its reference signal to an intermediate frequency.

14. An apparatus as described in claim 8 further comprising a device for converting the new signal to a signal selected from the group consisting of an audio, video, digital and analog signal.

* * * * *